United States Patent [19]

Tanaka et al.

[11] 4,295,711
[45] Oct. 20, 1981

[54] LIQUID CRYSTAL DISPLAY DEVICE

[75] Inventors: Hironari Tanaka; Shigeru Matsuyama; Tadashi Ishibashi; Kiyoshige Kinugawa; Yukihiro Sato, all of Mobara, Japan

[73] Assignee: Hitachi, Ltd., Tokyo, Japan

[21] Appl. No.: 68,576

[22] Filed: Aug. 22, 1979

[30] Foreign Application Priority Data

Aug. 23, 1978 [JP] Japan ................. 53-101776

[51] Int. Cl.³ ............................................. G02F 1/133
[52] U.S. Cl. ................................................... 350/334
[58] Field of Search ........................................ 350/334

[56] References Cited

U.S. PATENT DOCUMENTS

| | | | |
|---|---|---|---|
| 3,991,463 | 11/1976 | Squituri et al. | 350/334 X |
| 4,142,780 | 3/1979 | Sasaki et al. | 350/334 |
| 4,165,607 | 8/1979 | Fedorowicz et al. | 350/334 X |

OTHER PUBLICATIONS

Buchoff; "Conductive Elastomers Make Small Flexible Contacts", *Electronics*, Sep. 19, 1974 pp. 122-125.

*Primary Examiner*—Edward S. Bauer
*Attorney, Agent, or Firm*—Craig and Antonelli

[57] ABSTRACT

In order to provide a good connection to external circuitry for a liquid crystal display device, electrode terminals provided on a substrate of the device are connected to lead terminals formed on a flexible sheet in alignment with the arrangement of the elecode terminals through an elongated planar hot-melt binder layer. Electrically conductive islands penetrating through the thickness of the binder layer are formed to be in alignment with the electrode terminals. Thus, in such a structure, good connection is attained between the display device and an external circuit through the lead terminals.

4 Claims, 9 Drawing Figures

LIQUID CRYSTAL DISPLAY DEVICE

BACKGROUND OF THE INVENTION

1. Field of the Invention

This invention relates to a liquid crystal display device which facilitates connection between a number of finely spaced lead electrodes thereof and an external circuit.

2. Description of the Prior Art

A structure as described below has been used in the past to connect a liquid crystal display device to an external circuit. FIG. 1 shows a terminal structure applicable to a liquid crystal display device 1 having an electrode terminal spacing of 1.5 mm or more, and projecting leads to be connected to electrode terminals are inserted into a socket or soldered to a printed circuit board in order to connect them to an external circuit. This structure permits a firm connecting between the leads and the external circuit, but if the spacing is narrower, the structure is not useful because adjacent terminals are likely to contact each other. In case of a liquid crystal display device having electrode terminal spacing of 1.0 mm or more, a structure may be used wherein, as shown in FIG. 2, a pad including conductive rubber members 3 and insulating rubber members 4 disposed alternately at the same intervals as the electrode terminal spacing is placed in such a manner that the conductive rubber members 3 of the pad are located between the electrode terminals of the liquid crystal display device and the leads formed on a circuit board (not shown), and the electrode terminals and the lead terminals are electrically connected by a mechanical force applied therebetween. In this structure, the spacing between adjacent conductive rubber members 3 cannot substantially be reduced. When the spacing between terminals is further narrowed, another structure may be used wherein a pad including an insulating rubber sheet 6 and thin metal wires 5 (e.g. gold-plated wires) embedded therein, as shown in FIG. 3, is placed in such a manner that the thin metal wires 5 are located between the electrode terminals of the liquid crystal display device and the lead terminals printed on a circuit board, and the electrode terminals and the lead terminals are electrically connected by a mechanical force applied therebetween. This structure may be used for a device having a terminal spacing of as narrow as 0.5 mm. However, when a liquid crystal display device has a great number of terminals and thus is of a relatively elongated shape, the above-mentioned structures using such pads as shown in FIGS. 2 and 3 involve difficulty in applying an even force to provide good electrical connection between the electrode terminals and lead terminals, and may cause mechanical damage to the liquid crystal display device if a greater force is applied to provide good electrical connection.

SUMMARY OF THE INVENTION

It is an object of the invention to provide a liquid crystal display device which facilitates connection between a number of finely spaced lead electrodes and an external circuit without suffering from the above-mentioned problems.

According to the above object of the present invention, there is provided a liquid crystal display device in which electrode terminals provided on the substrate thereof are connected to lead terminals formed on a flexible sheet in alignment with the arrangement of the electrode terminals through an elongated planar hot-melt binder layer, and electrically conductive islands penetrating through the thickness of the binder layer are formed to be in alignment with the electrode terminals. Such a structure of the display device permits good connection between the display device and an external circuit through the lead terminals.

DESCRIPTION OF THE PREFERRED EMBODIMENTS

Figure 1:
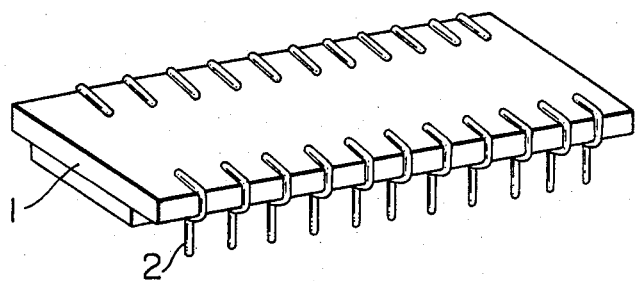
FIG. 1 shows a conventional liquid crystal display device with projecting lead wires.
Figure 2:
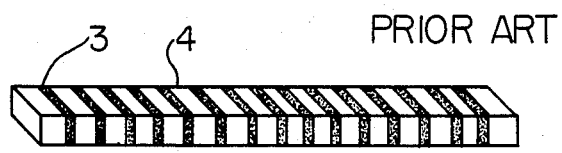
FIGS. 2 and 3 show connector pads which have been conventionally employed between the electrode terminals of a liquid crystal display device and the lead terminals of a circuit board.
Figure 3:
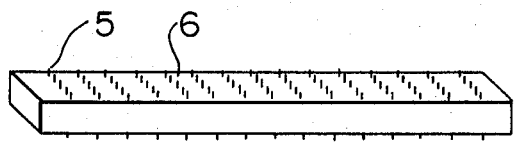
Figure 4:
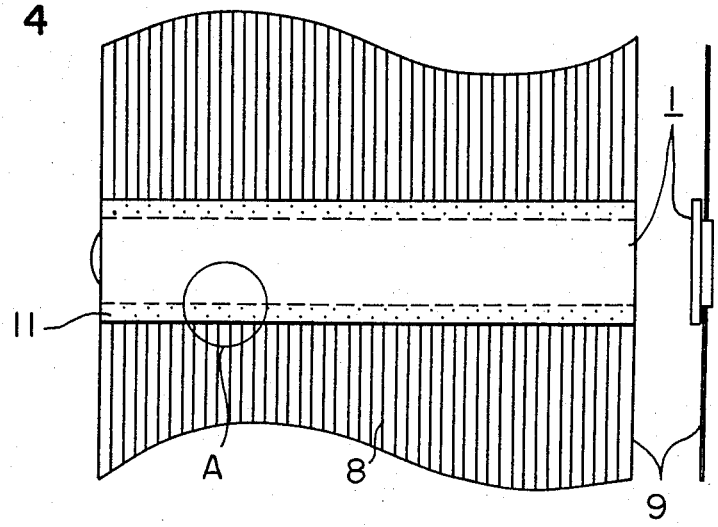
FIG. 4, FIG. 5a and FIG. 5b show embodiments of the persent invention.
Figure 5A:
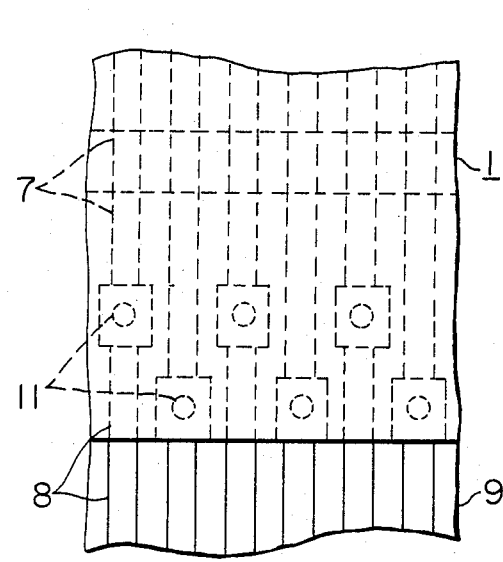
Figure 5B:
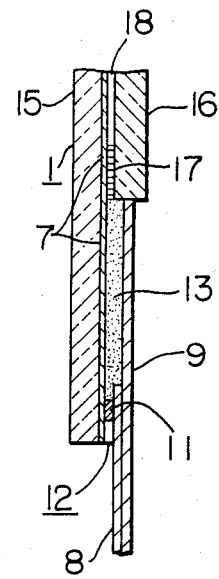
Figure 6:
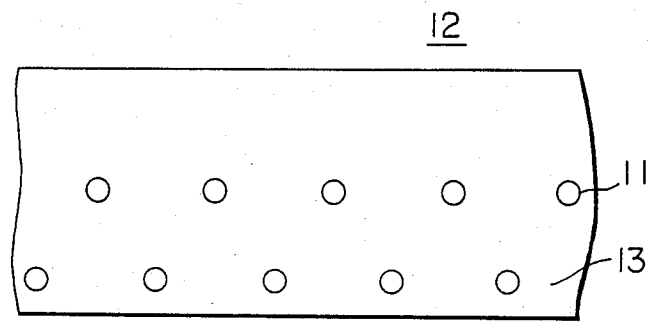
FIG. 6 shows a planar hot-melt binder layer used for the present invention.
Figure 7A:
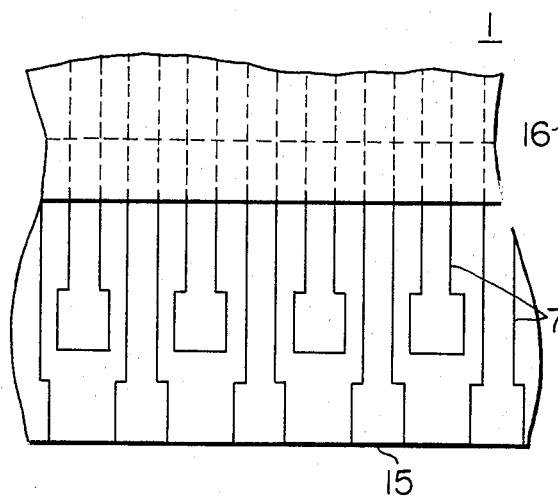
FIG. 7a and FIG. 7b show a terminal portion of a liquid crystal display device embodying the present invention.
Figure 7B:
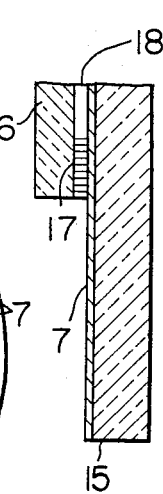

FIG. 4 shows one embodiment of the present invention, FIG. 5a shows an enlarged plan view of a portion A in FIG. 4, and FIG. 5b shows a lateral cross section of the portion A. In the figures, numeral 1 designates a liquid crystal display device, numeral 7 designates transparent conductor electrode terminals thereof, numeral 8 designates leads to be connected with the electrode terminals, which are formed on a flexible sheet 9 made of polyimide or glass epoxy resin, and numeral 11 designates conductor portions which are like islands disposed in an elongated planar hot-melt binder (thermoplastic) layer 12. The conductor portions 11 are made up of more than 10% by volume of, for example, Ag, Au or Pd powder contained in the hot-melt binder layer 12. Numeral 13 designates an ordinary insulating hot-melt binder layer which, together with the conductor portions 11, constitutes the elongated planar hot-melt binder layer 12 as shown in FIG. 6. Numerals 15 and 16 designate upper and lower substrates of the liquid crystal display device 1, which are made of glass and on which transparent conductive layers are formed, respectively. Numeral 17 designates a frit sealant for sealing the upper and lower substrates of the device 1 in their peripheral portions, and numeral 18 designates liquid crystal. The hot-melt binder material may be EVA (ethylene vinyl acetate), nylon, polyester, polyvinyl butyral or any other suitable resin. In general, a liquid crystal display device consumes only a small amount of power and thus the required current is very small. Therefore, the conductor portions 11 in the planar hot-melt binder layer are permitted to have relatively high resistance. FIGS. 7a and 7b show, respectively, a plan view and a lateral cross-sectional view of an electrode terminal portion of the liquid crystal display device 1. The leads 8 in the device according to the present invention are formed on the flexible sheet 9 so that they can be handled easily. In addition, the lead can be sequentially bonded by heat on the transparent conductive film electrode terminals 7 located in the periphery of the upper substrate 15 of the liquid crystal display device 1 by using the planar hot-melt binder 12 in which the conductor portions 11 are provided. Therefore, the bonding or connecting process is easy and there is no risk of mechanical damage to the liquid crystal display device 1 due to excessive pressure. If the electrode terminals are disposed in a zigzag manner as shown in FIGS 5a and 7a instead of a linear arrangement, connecting terminals of relatively large area may be provided at the edges of the leads thus preventing adjacent electrodes from being short-circuited even if part of the conductor portions in the hot-melt binder, when heated, is molten and spreads to a small extent.

As described above, according to the present invention, a liquid crystal display device having a number of finely spaced lead electrodes can be connected to an external circuit streadily and easily.

We claim:

1. A liquid crystal display device comprising:
   a liquid crystal portion disposed between upper and lower substrates,
   a plurality of electrode terminals provided on said upper substrate,
   insulating binder material connected to said electrode terminals and including electrically conductive islands penetrating through said insulating binder material, and
   a plurality of lead electrodes provided on a sheet, wherein said insulating binder material bonds said electrode terminals to said lead electrodes with said lead electrodes connected through said electrically conductive islands to said plurality of electrode terminals.

2. A liquid crystal display device according to claim 1 wherein said binder material takes the form of an elongated planar hot-melt binder layer the electrically conductive islands of which are disposed in alignment with the arrangement of said electrode terminals, said sheet is a flexible sheet, and said lead electrodes are disposed in alignment with the arrangement of said electrode terminals and adapted to connect therethrough said liquid crystal display device to an external circuit.

3. A liquid crystal display device according to claim 1 wherein said plurality of electrodes are disposed in a zigzag line in such a manner that they alternately deviate in the direction perpendicular to that along the arrangement of said electrode terminals.

4. A liquid crystal display device according to claim 2 wherein said electrically conductive islands comprise the same material as said hot-melt binder, containing more than 10% in volume of silver powder.

* * * * *